(12) United States Patent
Toyoda et al.

(10) Patent No.: US 6,602,599 B1
(45) Date of Patent: Aug. 5, 2003

(54) LOW-STAINING ADHESIVE SHEETS AND METHOD FOR REMOVING RESIST MATERIAL

(75) Inventors: Eiji Toyoda, Osaka (JP); Makoto Namikawa, Osaka (JP); Yoshio Terada, Osaka (JP)

(73) Assignee: Nitto Denko Corporation, Osaka (JP)

( * ) Notice: Subject to any disclaimer, the term of this patent is extended or adjusted under 35 U.S.C. 154(b) by 48 days.

(21) Appl. No.: 09/590,131

(22) Filed: Jun. 9, 2000

(30) Foreign Application Priority Data

| Jun. 10, 1999 | (JP) | 11-163857 |
| Dec. 24, 1999 | (JP) | 11-367785 |
| Jan. 20, 2000 | (JP) | 2000-011094 |

(51) Int. Cl.$^7$ ............................................. B32B 27/30
(52) U.S. Cl. ..................... 428/355 AC; 428/355 EP; 428/355 R; 428/41.3; 428/41.5
(58) Field of Search ................. 428/355 AC, 355 EP, 428/355 R, 41.3, 41.5

(56) References Cited

U.S. PATENT DOCUMENTS 4,181,635 A    1/1980   Takamatsu et al.
5,229,195 A    7/1993   Maruoka et al.

FOREIGN PATENT DOCUMENTS

| EP | 0 304 779    | 3/1989  |
| EP | 0 819 746 A2 | 1/1998  |
| EP | 0 947 553 A2 | 10/1999 |

OTHER PUBLICATIONS

European Search Report dated Mar. 6, 2002.

*Primary Examiner*—Roibert Dawson
*Assistant Examiner*—Christopher M Keehan
(74) *Attorney, Agent, or Firm*—Sughrue Mion, PLLC

(57) ABSTRACT

A low-staining adhesive sheet provided with an adhesive layer containing as the main component a pressure-sensitive adhesive polymer on a base film, wherein the pressure-sensitive adhesive polymer is substantially free from oligomeric low-molecular weight matters; and a method for removing a resist material by using this low-staining adhesive sheet. This low-staining adhesive sheet gives no organic staining matters remaining on the surface of article (for example, substrate) to be used as an adherend and is useful in removing a resist material and foreign matters, and re-peeling surface-protectors, masking materials, and other materials.

8 Claims, No Drawings

LOW-STAINING ADHESIVE SHEETS AND METHOD FOR REMOVING RESIST MATERIAL

FIELD OF THE INVENTION

This invention relates to a technique for relieving staining on an adherend caused by re-peelable adhesive sheets to be used in manufacturing various industrial members, in particular, fine-processed parts such as semiconductors, circuits, various printed substrates, various masks and lead frames.

DESCRIPTION OF THE RELATED ART

In manufacturing, for example, a semiconductor device, a desired circuit is formed by applying a resist material onto a silicon wafer, forming a resist pattern (resist film image) by a conventional photoprocessing technique, etching by using the pattern as a mask, and then removing the resist material which is unnecessary any more. Next, the application of the resist material is repeated to form the subsequent circuit. In case of forming circuits on various substrates, unnecessary resist materials are removed after the formation of resist patterns similar to the above process.

It has been a practice that resist materials which are unnecessary any more are removed by using an asher (ashing means), a solvent or a chemical. However, it takes a long time to remove resist materials by using an asher. In this case, moreover, it is feared that impurities in resist materials are injected into wafers and semiconductor substrates are damaged. On the other hand, use of solvents or chemicals brings about a problem of the pollution of the working environment.

Accordingly, there has been recently proposed a method with the use of adhesive sheets (while the present specification sometimes uses the word "sheets" as a plurality form, what is meant by sheets herein is not just a plurality of sheets, but a genus of sheets. However, for simplification, we basically use the word "sheet" hereinafter.). In this method, an adhesive sheet provided with an adhesive layer containing a pressure-sensitive adhesive polymer as the main component formed on a base film is adhered to the upper face of a resist pattern and, after a specific treatment (for example, heating), the adhesive sheet is peeled to thereby remove the resist material together with the adhesive sheet from the substrate. In this method, however, it is sometimes observed that a large amount of organic staining matters originating in the adhesive sheet remain on the substrate after peeling the resist material and, therefore, it is needed to remove these staining matters after the completion of the peeling procedure, which makes this method not always convenient.

Although the example described above pertains to a method for removing a resist material, it has been a practice too in the fields relating to, for example, semiconductors to use a similar adhesive sheet as a means for removing foreign matters (contaminants) present on the substrate surface. Namely, the foreign matters are adhered to an adhesive sheet and then removed together with the sheet. In this case, it is sometimes observed that a large amount of organic staining matters originating in the adhesive sheet remain on the substrate, similar to the case as described above. When the adhesive sheet is employed as a re-peelable material other than those described above (for example, surface protector for metal plate, and coating mask), it is sometimes observed that a large amount of organic staining matters originating in the adhesive sheet remain on the surface of the metal plate, similar to the case as described above.

SUMMARY OF THE INVENTION

Under these circumstances, an object of the invention is to provide a low-staining adhesive sheet capable of protecting the surface of adherend (for example, substrate) from contamination with organic staining matters originating in the adhesive sheet, when employed as a re-peelable adhesive sheet, for example, for removing a resist material or foreign matters, or for use as a surface-protector, masking material or the like.

Another object of the invention is to provide a method for removing a resist material by using this adhesive sheet.

The inventors have conducted intensive studies to achieve these objects. As a result, they have clarified that these organic staining matters remaining on the surface of adherend after peeling the adhesive sheet originate in a pressure-sensitive adhesive polymer (for example, acrylic polymer) contained as the main component in the adhesive layer. That is to say, because of having a broad distribution range of molecular weight and containing a large amount of oligomeric low-molecular weight matters, this pressure-sensitive adhesive polymer is liable to undergo breakage or cohesive failure, thereby causing the adherend contamination with organic matters.

Namely, the inventors have found out that, when the adhesive layer in the adhesive sheet provided with the adhesive layer containing as the main component a pressure-sensitive adhesive polymer on a base film is substantially free from oligomeric low-molecular weight matters at least in the step of peeling the sheet, then the pressure-sensitive adhesive polymer undergoes neither breakage nor cohesive failure and thus the adherend can be protected from contamination with organic matters.

Based on this finding, the inventors have conducted further studies and, as a result, found out that the adherend contamination with organic matters can be largely relieved by reducing the content of low-molecular weight matters and narrowing the distribution range of molecular weight by, for example, reprecipitating the pressure-sensitive adhesive polymer from a poor solvent, thereby completing the invention.

The inventors have further found out that the adherend contamination with organic matters can be largely relieved by effectively crosslinking the pressure-sensitive adhesive polymer (involving the low-molecular weight matters) by blending a polyfunctional compound therewith so as to give a gel fraction of at least 90%, as another means for solving the object, thereby completing the invention.

Accordingly, the invention provides a low-staining adhesive sheet provided with an adhesive layer containing as the main component a pressure-sensitive adhesive polymer on a base film, wherein the pressure-sensitive adhesive polymer is substantially free from oligomeric low-molecular weight matters, e.g., the pressure-sensitive adhesive polymer preferably contains oligomeric low-molecular weight matters in an amount of 5 wt % or less, more preferably 3 wt % or less (first aspect of the invention); in particular, the low-staining adhesive sheet wherein the pressure-sensitive adhesive polymer is substantially free from low-molecular weight matters having a molecular weight of 5,000 or less (second aspect of the invention); the low-staining adhesive sheet wherein the pressure-sensitive adhesive polymer has a degree of molecular weight distribution (weight-average molecular weight/number-average molecular weight) of 10 or less (third aspect of the invention); the low-staining adhesive sheet wherein the pressure-sensitive adhesive polymer has been reprecipitated from a poor solvent (fourth aspect of the invention); and the low-staining adhesive sheet wherein the adhesive layer contains, in addition to the pressure-sensitive adhesive polymer, a polyfunctional compound for crosslinking the pressure-sensitive adhesive polymer (fifth aspect of the invention).

The invention further provides the low-staining adhesive sheet wherein the pressure-sensitive adhesive polymer has been crosslinked so as to give a gel fraction of at least 90% and is substantially free from oligomeric low-molecular weight matters (sixth aspect of the invention); and the low-staining adhesive sheet which have been designed to give a gel fraction of at least 95% (seventh aspect of the invention).

As more particular embodiments of such a low-staining adhesive sheet, the invention further provides the low-staining adhesive sheet wherein the pressure-sensitive adhesive polymer is an acrylic polymer containing as the main monomer an alkyl (meth)acrylate (eighth aspect of the invention); the low-staining adhesive sheet wherein the adhesive layer contains, in addition to the pressure-sensitive adhesive polymer, a polymerizable compound having at least one unsaturated double bond in its molecule and a polymerization initiator (ninth aspect of the invention); and the low-staining adhesive sheet wherein the polymerization initiator is a photopolymerization initiator and the adhesive layer is a photocuring one (tenth aspect of the invention).

Furthermore, the invention provides the low-staining adhesive sheet to be re-peeled for removing a resist material and foreign matters, and for use as a re-peeling surface-protector, masking material, or the like (eleventh aspect of the invention); and a method for removing a resist material which comprises adhering the low-staining adhesive sheet to an article having a resist pattern, curing the low-staining adhesive sheet in case of a curing one, and then removing the resist material together with the sheet from the article by a peeling procedure (twelfth aspect of the invention).

In case of a curing adhesive sheet, the "gel fraction" as used herein means a value measured after curing the adhesive sheet under definite conditions.

DETAILED DESCRIPTION OF THE INVENTION

Preferable examples of the base film to be used in the invention are plastic films comprising, for example, polyethylene, polypropylene, polyethylene terephthalate or acetyl cellulose and usually having a thickness of from 10 to 100 μm. When the adhesive layer to be formed on the base film is a photocuring one as will be described hereinafter, a plastic film permeable to light, for example, ultraviolet rays may be appropriately selected therefor.

In the invention, an adhesive layer usually having a thickness of 10 to 180 μm is formed on the base film to give an adhesive sheet in the form of a sheet or a tape. This adhesive layer contains as the main component a pressure-sensitive adhesive polymer. The pressure-sensitive adhesive polymer may be an arbitrary one, so long as it has a pressure-sensitive adhesiveness and is highly compatible with a resist material on an article or foreign matters (contaminants, particles) attached thereto. Namely, use may be made therefor of various publicly known polymers commonly applied to pressure-sensitive adhesive polymers. It is particularly preferable to use an acrylic polymer containing an alkyl (meth)acrylate as the main monomer therefor.

Such an acrylic polymer can be synthesized by using, as the main monomer, an alkyl (meth)acrylate, namely, an acrylic acid or methacrylic acid ester of an alcohol usually having not more than 12 carbon atoms (for example, n-butyl acrylate, 2-ethylhexyl acrylate), optionally together with a carboxylor hydroxyl-containing monomer (for example, acrylic acid, methacrylic acid, hydroxyethyl acrylate) or another modifying monomer (for example, vinyl acetate, vinyl propionate, styrene, acrylonitrile, acrylamide, glycidyl acrylate) and polymerizing these monomers by conventional methods such as solution polymerization, emulsion polymerization, suspension polymerization or bulk polymerization.

The acrylic polymer thus synthesized generally has a broad molecular weight distribution range. Namely,: the acrylic polymer is in the form of mixtures containing various components over a broad range from oligomers having a molecular weight of not more than several thousands to polymers having a molecular weight of several millions and the content of the oligomers having a molecular weight of not more than several thousands amounts to several % to 10% by weight. A characteristic of the invention resides in that a pressure-sensitive adhesive polymer typified by such an acrylic polymer is reprecipitated from a poor solvent so that it becomes substantially free from low-molecular weight matters having a molecular weight of 5,000 or less, preferably 10,000 or less. It is recommended that the degree of molecular weight distribution (weight-average molecular weight/number-average molecular weight) is 10 or less, preferably 8 or less and still preferably 5 or less (but not less than 2 in usual).

The reprecipitation is a treatment which is carried out in the following manner. In the case of an acrylic polymer, a solvent in which the polymer shows a low solubility (for example, alcoholic solvents such as methanol, ethanol or isopropyl alcohol, or aliphatic hydrocarbon solvents such as hexane or petroleum ether) is employed as the poor solvent. After dissolving the polymer in this solvent, the resultant mixture is allowed to stand at a room temperature or a low temperature and then the polymer thus reprecipitated is recovered and dried. The method for the recovery of the low-molecular weight matters in the polymer is not restricted to this reprecipitation treatment but various publicly known methods may be employed therefor. However, a pressure-sensitive adhesive polymer having been subjected to the reprecipitation treatment as described above contains little low-molecular weight matters having a molecular weight of 5,000 or less, thereby being appropriately usable in the invention.

In the invention, it has been found out that a low-staining adhesive sheet, which is free from the problem of the contamination of the adherend surface due to organic matters remaining thereon, as observed conventionally, and can be appropriately usable as a re-peelable sheet, can be obtained by using a pressure-sensitive adhesive polymer substantially free from low-molecular weight matters having a molecular weight of 5,000 or less and by using the polymer having a narrow molecular weight distribution range, i.e., a degree of molecular weight distribution of 10 or less.

It is favorable that the pressure-sensitive adhesive polymer to be used in the invention has a weight-average molecular weight of from 500,000 to 5,000,000 and a number-average molecular weight of form 300,000 to 3,000,000. These average molecular weights and degree of molecular weight distribution are expressed in data determined by the gel permeation chromatography (GPC) method in terms of polystyrene. It can be confirmed on the basis of a molecular weight distribution curve whether or not the polymer contains low-molecular weight matters having a molecular weight of 5,000 or less.

It is desirable that the pressure-sensitive adhesive polymer further contains a polyfunctional compound such as a polyisocyanate compound, a polyfunctional epoxy compound or an aziridine compound to thereby elevate the cohesive force.

In another method according to the invention, a polyfunctional compound is preliminarily added to the adhesive layer and the pressure-sensitive adhesive polymer is crosslinked by reacting the polyfunctional compound with the carboxyl or hydroxyl group in the pressure-sensitive adhesive polymer molecule in the step of forming the adhesive layer on the base film (i.e., the drying step following the application or the subsequent heating step). In particular, the low-molecular weight components contained in the polymer are allowed to sufficiently participate in the crosslinking reaction so as to give a gel fraction of at least 90%, preferably at least 95%. Thus, a pressure-sensitive adhesive polymer substantially free from oligomeric low-molecular weight matters can be obtained.

There has been practiced the treatment per se of crosslinking the adhesive layer with a polyfunctional compound. However, this crosslinking treatment aims not at polymerizing the low-molecular weight matters contained in the pressure-sensitive adhesive polymer, as in the case of the invention, but merely at elevating the cohesive force of an adhesive. By the conventional treatment, therefore, the gel fraction can be elevated to about 85% at the highest. Thus, the breakage or cohesive failure of the adhesive cannot be sufficiently prevented and the contamination of adherend cannot be avoided thereby.

Examples of the polyfunctional compound usable in the invention include polyfunctional epoxy compounds, polyisocyanate compounds and aziridine compounds. It is also favorable to use a combination of two or more polyfunctional compounds to thereby achieve sufficient crosslinkage. The amount of the polyfunctional compound may be appropriately determined so as to give a gel fraction of at least 90%, preferably at least 95%. It is usually recommended to use from 0.1 to 3 parts by weight, preferably from 2 to 10 parts by weight, of the polyfunctional compound per 100 parts by weight of the pressure-sensitive adhesive polymer.

As the adhesive layer in the invention, use may be made of various ones containing the specific pressure-sensitive adhesive polymer as described above as the main component. It is preferable to use a curing adhesive layer which contains, in addition to the pressure-sensitive adhesive polymer as described above as the main component, a polymerizable compound having at least one unsaturated double bond in its molecule and a polymerization initiator. It is particularly preferable that the polymerization initiator is a photopolymerization initiator and the adhesive layer is a photocuring one.

The polymerizable compound as described above is a nonvolatile compound having at least one unsaturated double bond in its molecule which can be cured by applying light or heat energy thereto. Examples thereof include phenoxypolyethylene glycol (meth) acrylate, $\epsilon$-caprolactone (meth)acrylate, polyethylene glycol di(meth)acrylate, polypropylene glycol di(meth) acrylate, trimethylolpropane tri(meth)acrylate, dipentaerythritol hexa (meth) acrylate, urethane (meth)acrylate, epoxy (meth)acrylate and oligoester (meth) acrylate. Either one of these compounds or a mixture of two or more thereof may be used. It is recommended that the polymerizable compound is used in an amount of from 10 to 400 parts by weight, preferably from 50 to 300 parts by weight, per 100 parts by weight of the pressure-sensitive adhesive polymer.

As the polymerization initiator as described above, use may be made of photopolymerization initiators capable of liberating a radical upon light irradiation, for example, benzyl dimethyl ketal, benzoin, benzoin ethyl ether and dibenzyl. It is also possible to use therefor polymerization initiators capable of liberating a radical upon application of heat energy, for example, organic peroxides such as benzoyl peroxide and azo initiators such as 2,2'-azobisisobutyronitrile. It is recommended that the polymerization initiator is used in an amount of from 0.1 to 10 parts by weight, preferably from 1 to 5 parts by weight, per 100 parts by weight of the pressure-sensitive adhesive polymer.

These adhesive layers of various types may further contain various publicly known additives such as tackifiers, colorants and aging inhibitors, so long as the effects of the invention are not damaged thereby.

The low-staining adhesive sheet of the invention having the constitution as described above is usable for various purposes, for example, in removing resist materials and foreign matters in the processes of manufacturing various industrial members, in particular, fine-processed parts such as semiconductors, circuits, various printed substrates, various masks and lead frames, and in re-peeling various substances other than those cited above, thereby contributing to the relief of adherend contamination. By taking advantage of the low-staining properties, moreover, this adhesive sheet is widely usable in various cases wherein the adhesive sheet is to be peeled during or after using, for example, surface-protecting, masking, and other re-peeling purposes.

According to the invention, a method for removing a resist material is provided as an invention pertaining to a method for using the low-staining adhesive sheet as described above. In this method, the low-staining adhesive sheet as described above is adhered, under heating and/or pressing if necessary, to an article having a resist pattern to thereby combine the adhesive layer with the resist material. After curing the low-staining adhesive sheet, if curing is necessary, curing one (in particular, photocuring by irradiating with ultraviolet rays at a dose of 300 to 3,000 mJ/cm$^2$, if photocuring is necessary), the resist material is removed together with the low-staining adhesive sheet from the article by a peeling procedure.

Compared with the conventional methods with the use of ashers (ashing means), solvents or chemicals, the removal method as described above can be easily carried out. Moreover, this method is free from fears of pollution of the working environment, injection of impurities contained in the resist material into wafers, or damage of semiconductor substrates. In this case, furthermore, no organic staining matter originating in the low-staining adhesive sheet remains on the article surface and thus no procedure for removing staining matters is needed after peeling the low-staining adhesive sheet. Thus, the resist material can be very conveniently removed thereby.

EXAMPLES

Now, the invention will be illustrated in greater detail by reference to the following Examples. In these Examples, Mw means the weight-average molecular weight of an acrylic polymer, Mn means the number-average molecular weight of an acrylic polymer, and Mw/Mn means the degree of molecular weight distribution of an acrylic polymer. In the method for removing a resist material as will be described in the following Examples, a resist film image A (resist pattern) means one formed on a semiconductor wafer in accordance with the method of Referential Example 1.

Referential Example 1

A resist composed of PHS (polyhydroxystyrene derivative) and an acid-generating agent was applied onto the surface of a silicon wafer (8 inch-semiconductor substrate) having an oxide film formed on the surface thereof. After forming a pattern by heating, exposing to light and developing, the oxide film was removed by dry etching with the use of the resist pattern as a mask. The resist pattern on the thus processed silicon wafer was referred to as the resist film image A.

Example 1

1,000 g of a 27% by weight solution in toluene of an acrylic polymer A (Mw=2,800,000, Mw/Mn=22) made of a copolymer of 2-ethylhexyl acrylate/methyl acrylate/acrylic acid at a weight ratio of 30/70/10 having been synthesized in a conventional manner was mixed with 70 kg of methanol and stirred at room temperature for 15 minutes. After the completion of stirring, the mixture was allowed to stand for 15 minutes. Next, the precipitate was taken up and the solvent was dried to give 190 g of an acrylic polymer B as a sticky white polymer. This acrylic polymer B, which had been thus reprecipitated from the poor solvent, showed Mw of 380,000 and Mw/Mn of 3.0. Based on the molecular weight distribution curve, it was found out that this acrylic polymer B was completely free from low-molecular weight matters having a molecular weight of 50,000 or less.

100 g of this acrylic polymer B, 50 g of polyethylene glycol 600 diacrylate (NK ESTER A-600™ manufactured by Shin-Nakamura Kagaku), 50 g of polyethylene glycol 200 dimethacrylate (NK ESTER 4G™ manufactured by Shin-Nakamura Kagaku), and 3 g of benzyl dimethyl ketal were dissolved in toluene. The adhesive solution thus obtained was applied onto a base film made of a polyester film of 50 μm in thickness and dried in a drying oven at 70° C. and 130° C. each for 3 minutes to form a photocuring adhesive layer of 35 μm in thickness. Thus a low-staining adhesive sheet was obtained.

Next, the low-staining adhesive sheet obtained above was adhered to the resist film image A on a silicon wafer by using pressure rollers under heating. Then it was irradiated with ultraviolet rays at a dose of 1,000 mJ/cm$^2$ by using a high-pressure mercury lamp to cure the adhesive sheet. Subsequently, the adhesive sheet was peeled together with the resist film image A so as to completely remove the image A from the silicon wafer. When observed under a microscope, the resist had been completely removed from the silicon wafer and no organic staining matter originating in the adhesive layer was found out.

Example 2

100 g of the acrylic polymer B obtained in Example 1, 100 g of polyethylene glycol 600 diacrylate (NK ESTER A-600™ manufactured by Shin-Nakamura Kagaku), 3 g of a polyisocyanate compound, 2 g of a polyfunctional epoxy compound and 3 g of benzyl methyl ketal were dissolved in toluene. By using the adhesive solution thus obtained, a low-staining adhesive sheet, was prepared as in Example 1. Then the resist film image A was peeled as in Example 1 but using the thus obtained adhesive sheet. When observed under a microscope, the resist had been completely removed from the silicon wafer and no organic staining matter originating in the adhesive layer was found out.

Comparative Example 1

An adhesive solution was prepared as in Example 1 but using 100 g (in terms of solid matters) of the acrylic polymer A before the reprecipitation from a poor solvent as a substitute for the acrylic polymer B. By using the thus obtained adhesive solution, an adhesive sheet was prepared as in Example 1. Then the resist film image A was peeled as in Example 1 but using the thus obtained adhesive sheet. When observed under a microscope, the resist had been mostly removed from the silicon wafer but organic staining matters originating in the adhesive layer remained thereon.

Example 3

100 g (in terms of solid matters) of the acrylic polymer A of Example 1, 52 g of polyethylene glycol 600 diacrylate (NK ESTER A-600™ manufactured by Shin-Nakamura Kagaku), 52 g of polyethylene glycol 200 dimethacrylate (NK ESTER 4G™ manufactured by Shin-Nakamura Kagaku), 1.9 g of a polyepoxy compound (TETRAD C™ manufactured by Mitsubishi Gas Chemical), 3.0 g of a polyisocyanate compound and 5.2 g of benzyl dimethyl ketal were dissolved in toluene and mixed. The solution thus obtained was applied onto a base film made of a polyester film of 50 μm in thickness and dried in a drying oven at 130° C. for 3 minutes to form a crosslinked photocuring adhesive layer of 35 μm in thickness. Thus a low-staining adhesive sheet was obtained.

Next, the gel fraction of the adhesive layer of this low-staining adhesive sheet was measured in the following manner. First, the photocuring adhesive layer of 35 μm in thickness was irradiated with ultraviolet rays at a dose of 1,000 mJ/cm$^2$ by using a high-pressure mercury lamp to cure the adhesive layer. After curing, a 15.0 g portion of the adhesive layer was introduced into 500 ml of ethyl acetate and stirred therein at 60° C. for 10 hours. Then the insoluble matters were filtered off and the filtrate was concentrated in a rotary evaporator and dried under reduced pressure (1 mmHg, 1 hour) to thereby completely remove the ethyl acetate. The obtained concentrate weighed 0.3 g. Therefore, the weight of the adhesive having been filtered off corresponded to 14.7 g and thus the gel fraction calculated therefrom was 98%.

By using this low-staining adhesive sheet, the resist film image A was peeled as in Example 1. When observed under a microscope, the resist had been completely removed from the silicon wafer and no organic staining matter originating in the adhesive layer was found out.

Example 4

100 g (in terms of solid matters) of the acrylic polymer A of Example 1, 100 g of polyethylene glycol 600 diacrylate (NK ESTER A-600™ manufactured by Shin-Nakamura Kagaku), 100 g of polyethylene glycol 200 dimethacrylate (NK ESTER 4G™ manufactured by Shin-Nakamura Kagaku), 1.9 g of a polyepoxy compound (TETRAD C™ manufactured by Mitsubishi Gas Chemical), 3.0 g of a polyisocyanate compound and 5.2 g of benzyl dimethyl ketal were dissolved in toluene and mixed. Then a low-staining adhesive sheet was prepared as in Example 3 but using the solution thus obtained.

The gel fraction of the photocuring adhesive layer of this low-staining adhesive sheet measured as in Example 3 was 99%. By using this low-staining adhesive sheet, the resist film image A was peeled as in Example 1. When observed under a microscope, the resist had been completely removed from the silicon wafer and no organic staining matter originating in the adhesive layer was found out.

Comparative Example 2

A low-staining adhesive sheet was prepared as in Example 3 but using no polyepoxy compound in the solution to be applied onto the base film. The gel fraction of the photocuring adhesive layer of this low-staining adhesive sheet measured as in Example 3 was 88%. By using this low-staining adhesive sheet, the resist film image A was peeled as in Example 1. When observed under a microscope, the resist had been mostly removed from the silicon wafer and but organic staining matters originating in the adhesive layer remained thereon.

As described above, use is made in the invention of a pressure-sensitive adhesive polymer wherein the content of low-molecular weight matters has been reduced by reprecipitation from a poor solvent or the low-molecular weight matters contained in the polymer have been sufficiently polymerized by crosslinking with the use of a polyfunctional compound so as to give a gel fraction of at least 90%. Thus, the pressure-sensitive adhesive polymer is substantially free from oligomeric low-molecular weight matters. Therefore, the invention can provide a low-staining adhesive sheet which gives no organic staining matters remaining on the surface of article (for example, substrate) to be used as an adherend and is useful in removing resist materials and foreign matters, and repeeling surface-protectors, masking materials, and other materials. The invention further provides a method for conveniently peeling and removing resist materials on articles by using this low-staining adhesive sheet.

What is claimed is:

1. A low-staining adhesive sheet comprising a base film and an adhesive layer comprising a pressure-sensitive adhesive polymer on the base film, wherein the pressure-sensitive adhesive polymer is an acrylic polymer comprising an alkyl(meth)acrylate unit as the main monomer unit, has a degree of molecular weight distribution of 10 or less and is substantially free from low-molecular weight oligomers having a molecular weight of 10,000 or less.

2. The low-staining adhesive sheet as claimed in claim 1, wherein the pressure-sensitive adhesive polymer has been reprecipitated from a poor solvent.

3. The low-staining adhesive sheet as claimed in claim 1, wherein the adhesive layer comprises, in addition to the pressure-sensitive adhesive polymer, a polyfunctional compound for crosslinking the pressure-sensitive adhesive polymer.

4. The low-staining adhesive sheet as claimed in claim 1, wherein the pressure-sensitive adhesive polymer has been crosslinked so as to give a gel fraction of at least 90% and is substantially free from low-molecular weight oligomers.

5. The low-staining adhesive sheet as claimed in claim 4, which has a gel fraction of at least 95%.

6. The low-staining adhesive sheet as claimed in claim 1, wherein the adhesive layer comprises, in addition to the pressure-sensitive adhesive polymer, a polymerizable compound having at least one unsaturated double bond in its molecule, and a polymerization initiator.

7. The low-staining adhesive sheet as claimed in claim 6, wherein the polymerization initiator is a photopolymerization initiator and the adhesive layer is a photocuring one.

8. A method for removing a resist material, which comprises adhering a low-staining adhesive sheet as claimed in claim 1 to an article having a resist pattern, curing the low-staining adhesive sheet, if curing is necessary, and then removing a resist material together with the sheet from the article by peeling the sheet.

* * * * *